United States Patent
Kim et al.

(10) Patent No.: US 12,389,756 B2
(45) Date of Patent: Aug. 12, 2025

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: Jeong-Oh Kim, Paju-si (KR); Myung-Jae Yoo, Paju-si (KR); Geum-Young Lee, Paju-si (KR); Seong-Ho Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 520 days.

(21) Appl. No.: 17/944,777

(22) Filed: Sep. 14, 2022

(65) Prior Publication Data
US 2023/0200146 A1 Jun. 22, 2023

(30) Foreign Application Priority Data
Dec. 17, 2021 (KR) .......... 10-2021-0181416

(51) Int. Cl.
*H10K 59/123* (2023.01)
*H10K 50/813* (2023.01)
*H10K 59/12* (2023.01)
*H10K 71/00* (2023.01)
*H10K 102/00* (2023.01)

(52) U.S. Cl.
CPC ......... *H10K 59/123* (2023.02); *H10K 50/813* (2023.02); *H10K 71/00* (2023.02); *H10K 59/1201* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 12,167,639 B2 * | 12/2024 | Kim | H10K 59/88 |
| 2005/0208330 A1 | 9/2005 | Raychaudhuri et al. | |
| 2012/0069259 A1 | 3/2012 | Oh et al. | |
| 2017/0345877 A1 | 11/2017 | Hwang | |
| 2021/0399071 A1 * | 12/2021 | Choi | H10K 50/844 |
| 2022/0069251 A1 | 3/2022 | Lee et al. | |
| 2022/0199746 A1 * | 6/2022 | Kim | H10K 50/865 |
| 2023/0209921 A1 * | 6/2023 | Lim | H10K 59/8052 257/40 |
| 2023/0266854 A1 * | 8/2023 | Yoo | G06F 3/03545 345/174 |

(Continued)

FOREIGN PATENT DOCUMENTS

| | | |
|---|---|---|
| DE | 112022007313 T5 * | 3/2025 |
| EP | 3902010 B1 * | 3/2025 |
| KR | 20060060179 A * | 6/2006 |

(Continued)

*Primary Examiner* — Michael Lebentritt
(74) *Attorney, Agent, or Firm* — Morgan, Lewis & Bockius LLP

(57) ABSTRACT

An organic light emitting diode display device and a method for manufacturing the same are disclosed. The organic light emitting diode display device includes: a substrate having first and second subpixels, each of the first and second subpixels having an emission area; a thin film transistor in each of the first and second subpixels; a first anode connected to the thin film transistor and having a first area; and a second anode having a second area greater than the first area, wherein the second anode is disposed on the first anode to cover the first anode.

17 Claims, 8 Drawing Sheets

(56) References Cited

U.S. PATENT DOCUMENTS

2023/0320133 A1* 10/2023 Choi .................. H10K 71/00
2024/0298469 A1*  9/2024 Ito ................... H10K 59/353

FOREIGN PATENT DOCUMENTS

| KR | 10-2006-0129058 A |   | 12/2006 |
| --- | --- | --- | --- |
| KR | 10-2012-0030701 A |   | 3/2012 |
| KR | 10-2017-0038599 A |   | 4/2017 |
| KR | 10-1795579 B1 |   | 11/2017 |
| KR | 10-2018-0074164 A |   | 7/2018 |
| KR | 20240025954 A | * | 2/2024 |

* cited by examiner

ORGANIC LIGHT EMITTING DIODE DISPLAY DEVICE AND METHOD OF FABRICATING THE SAME

CROSS REFERENCE TO RELATED APPLICATIONS

The present application claims the priority benefit of Republic of Korea Patent Application No. 10-2021-0181416 filed in Republic of Korea on Dec. 17, 2021, which is hereby incorporated by reference herein in its entirety.

TECHNICAL FIELD

The present disclosure relates to an organic light emitting diode display device, and more particularly, to an organic light emitting diode display device where a repair process is easily performed and a method of fabricating the same.

DISCUSSION OF THE RELATED ART

Recently, an organic light emitting diode (OLED) display device which has been the subject of recent research uses a light emitting diode as an emissive element and has advantages in terms of such as an emission efficiency, a luminance and a viewing angle.

In the OLED display device, subpixels including the light emitting diode are arranged in a matrix and a brightness of the subpixel selected by a scan signal is adjusted according to a gray level of a data.

To control each subpixel on and off, the OLED display device includes an array substrate having a thin film transistor (TFT) as a switching element.

In a relatively high resolution OLED display device, since the array substrate has a lot of TFTs and a lot of signal lines and a fabrication process is complicated, deterioration occurs.

As a result, after the fabrication process of the array substrate is completed, an array test where electrical deterioration of the TFTs and the signal lines is detected is performed. To repair a deteriorated subpixel detected in the array test, the array substrate has an additional repair region.

Accordingly, in the relatively high resolution OLED display device, an emission area of the subpixel is reduced and it is difficult to obtain a sufficient aperture ratio.

SUMMARY

Accordingly, embodiments of the present disclosure are directed to an organic light emitting diode display device and a method of fabricating the same that substantially obviates one or more of the problems due to limitations and disadvantages of the related art.

An aspect of the present disclosure is to provide an organic light emitting diode display device where a relatively high aperture ratio is obtained in a high resolution model and a method of fabricating the organic light emitting diode display device.

Another aspect of the present disclosure is to provide an organic light emitting diode display device where a reliability of a result of an array test is improved and a method of fabricating the organic light emitting diode display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting diode display device comprises: a substrate having first and second subpixels, each of the first and second subpixels having an emission area; a thin film transistor in each of the first and second subpixels; a first anode connected to the thin film transistor and having a first area; and a second anode having a second area greater than the first area, wherein the second anode is disposed on the first anode to cover the first anode.

In another aspect, a method of fabricating an organic light emitting diode display device comprises: forming a thin film transistor in each of first and second subpixels on a substrate, each of the first and second subpixels having an emission area; forming a first anode connected to the thin film transistor and having a first area; performing an array test to the substrate; and forming a second anode on the first anode, the second anode having a second area greater than the first area.

In still another aspect, an organic light emitting diode display device comprises a plurality of subpixels, each subpixel including: a thin film transistor; a first anode connected to the thin film transistor and having a first area; and a second anode having a second area greater than the first area and corresponding to an emission area of the subpixel, wherein the second anode is disposed on the first anode to cover the first anode.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain principles of the disclosure. In the drawings.

DETAILED DESCRIPTION

Figure 1:
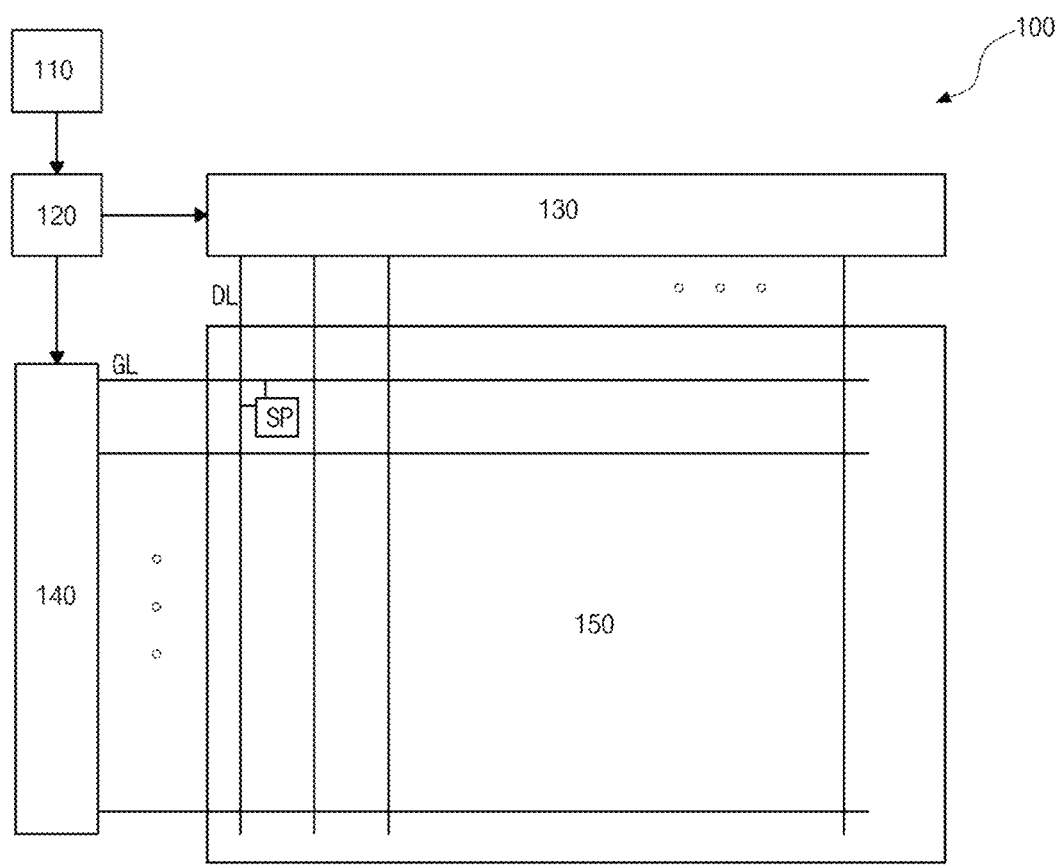
FIG. 1 is a view showing an organic light emitting diode display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an organic light emitting diode display device and a method of fabricating the organic light emitting diode display device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

FIG. 1 is a view showing an organic light emitting diode display device according to a first embodiment of the present disclosure.

As shown in FIG. 1, an organic light emitting diode (OLED) display device 100 includes an image processing unit 110, a timing controlling unit 120, a data driving unit 130, a gate driving unit 140 and a display panel 150.

The image processing unit 110 may output an image signal and a plurality of timing signals including a data enable signal, a vertical synchronization signal, a horizontal synchronization signal and a clock signal.

The timing controlling unit 120 receives the image signal and the plurality of timing signals including the data enable signal, the vertical synchronization signal, the horizontal synchronization signal and the clock signal. The timing controlling unit 120 outputs an image data by rearranging the image signal according to the plurality of timing signals. In addition, the timing controlling unit 120 outputs a gate control signal for controlling an operation timing of the gate driving unit 140 and a data control signal for controlling an operation timing of the data driving unit 130 based on the plurality of timing signals.

The data driving unit 130 outputs a data signal using the image data supplied from the timing controlling unit 120 and a gamma reference voltage in response to the data control signal supplied from the timing controlling unit 120. The data driving unit 130 supplies the data signal through a data line DL to the display panel 150. The data driving unit 130 may be formed as an integrated circuit (IC).

The gate driving unit 140 outputs a gate signal in response to the gate control signal supplied from the timing controlling unit 120. The gate driving unit 140 supplies the gate signal through a gate line GL to the display panel 150. The gate driving unit 140 may be formed as an integrated circuit (IC) or may be formed in the display panel 150 as a gate in panel (GIP) type.

The display panel 150 displays an image in response to the data signal and the gate signal supplied from the data driving unit 130 and the gate driving unit 140 and includes a plurality of subpixels SP for displaying an image.

The plurality of subpixels SP may include a red subpixel, a green subpixel and a blue subpixel or a white subpixel, a red subpixel, a green subpixel and a blue subpixel. The plurality of subpixels SP may have different emission areas according to an emission property.

Each of the plurality of subpixels SP includes a light emitting diode E (of FIG. 3) emitting a light due to the data signal and a driving circuit for driving the light emitting diode E.

Figure 2A:
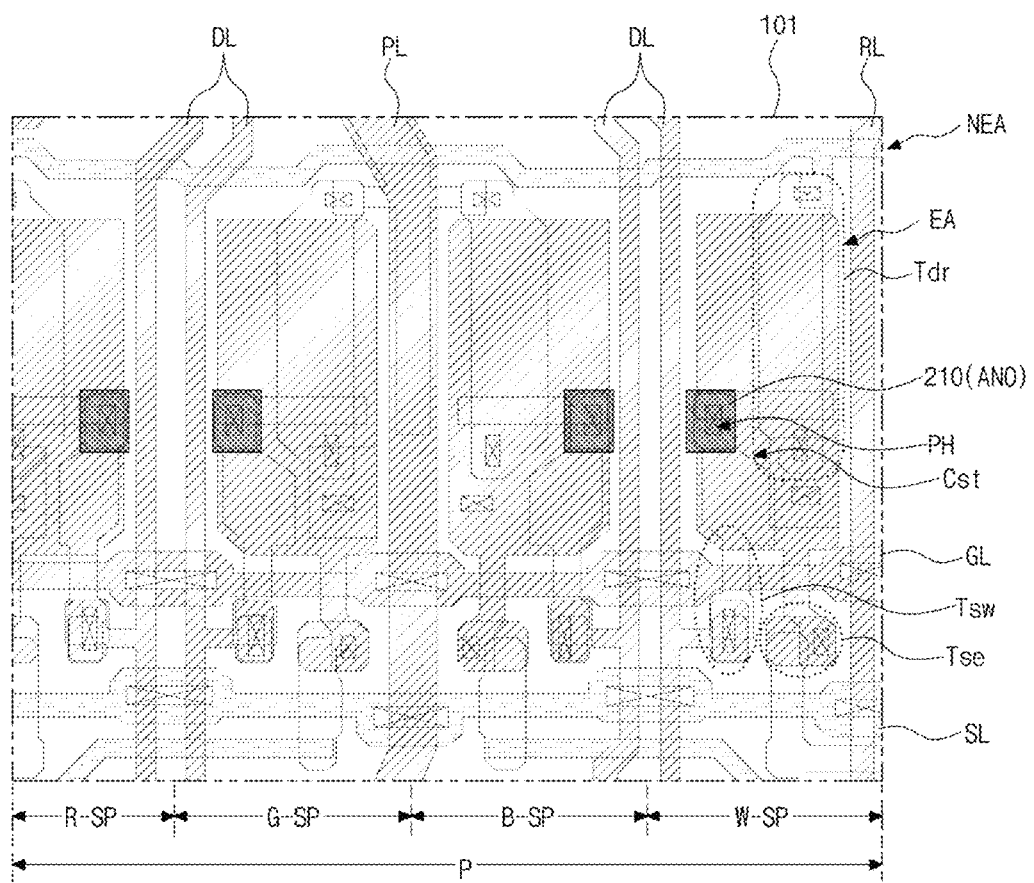
FIGS. 2A and 2B are plan views showing subpixels of an organic light emitting diode display device according to a first embodiment of the present disclosure.
Figure 2B:
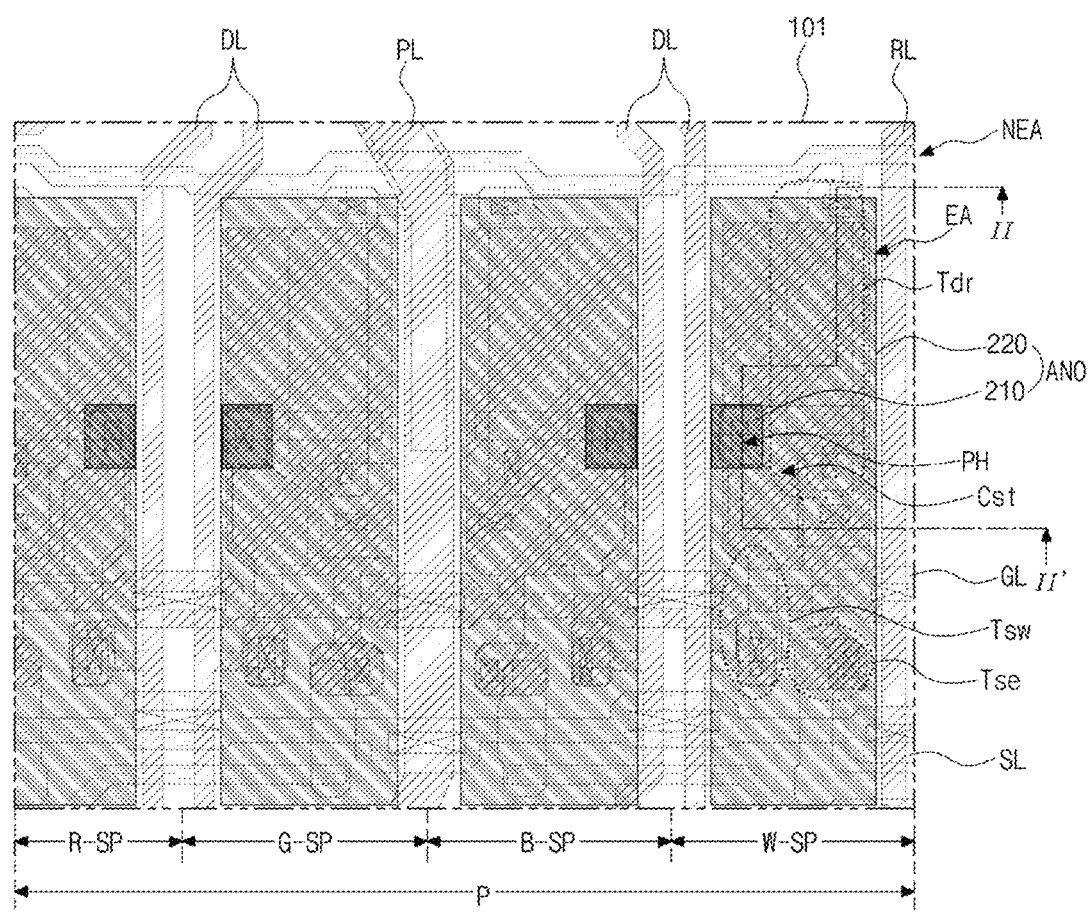

The driving circuit includes a switching thin film transistor (TFT) Tsw (of FIGS. 2A and 2B), a driving TFT Tdr (of FIGS. 2A and 2B) and a storage capacitor Cst (of FIGS. 2A and 2B).

A structure of each subpixel will be illustrated hereinafter with reference to FIGS. 2A and 2B.

FIGS. 2A and 2B are plan views showing subpixels of an organic light emitting diode display device according to a first embodiment of the present disclosure. FIG. 2A shows subpixels after a first anode is formed and FIG. 2B shows subpixels after first and second anodes are formed.

Figure 3:
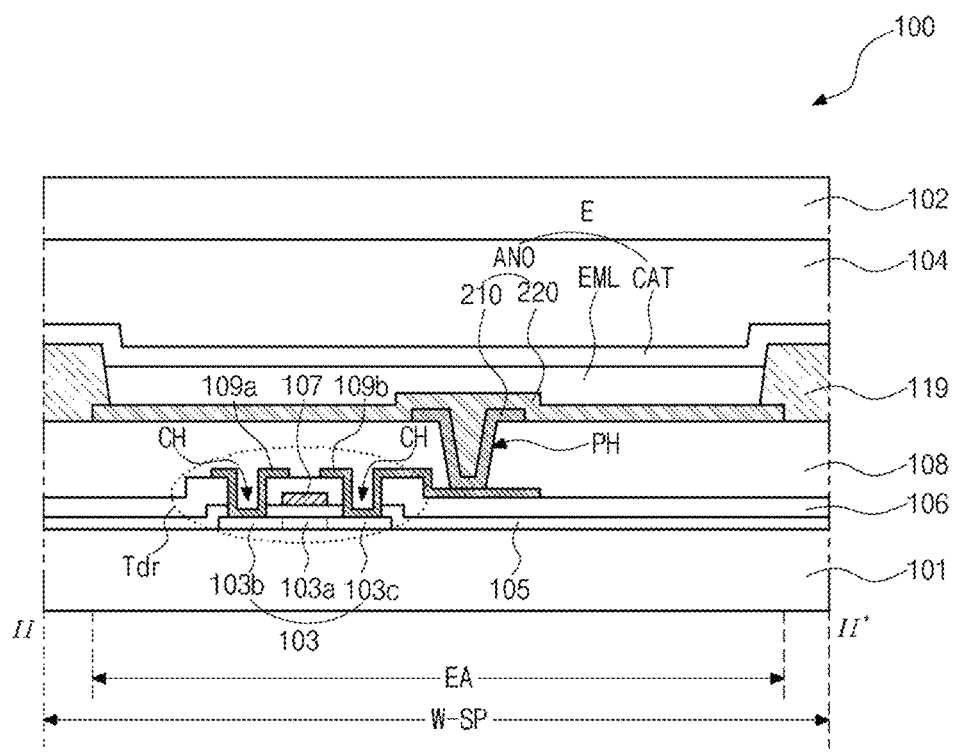
FIG. 3 is a cross-sectional view showing a subpixel of an organic light emitting diode display device according to a first embodiment of the present disclosure.

An organic light emitting diode (OLED) display device 100 according to a first embodiment of the present disclosure may have a top emission type or a bottom emission type according to a transmission direction of a light emitted from the light emitting diode E (of FIG. 3). In the bottom emission type, since the driving circuit is disposed between an organic emitting layer and an image display surface, an aperture ratio may be reduced due to the driving circuit. In the top emission type, since the driving circuit is not disposed between the organic emitting layer and the image display surface, an aperture ration may be improved.

The OLED display device 100 according to a first embodiment of the present disclosure exemplarily has a top emission type.

In FIG. 2A, the light emitting diode E (of FIG. 3) and the driving circuit driving the light emitting diode E are disposed in each of the red, green, blue and white subpixels R-SP, G-SP, B-SP and W-SP on a substrate 101 having an emission area EA and a non-emission area NEA surrounding the emission area EA.

In addition, a plurality of signal lines for supplying a driving power and a signal to the light emitting diode E and the driving circuit are disposed on the substrate 101.

The driving circuit includes the switching TFT Tsw, a sensing TFT Tse, the driving TFT Tdr and the storage capacitor Cst, and the plurality of signal lines include the data line DL, the gate line GL, a power line PL, a sense line SL and a reference line RL.

The power line PL, the reference line RL and the data line DL are disposed along a vertical direction, and the gate line GL is disposed along a horizontal direction. The data line DL and the gate line GL cross each other to define the emission area EA. Each of the red, green, blue and white subpixels R-SP, G-SP, B-SP and W-SP has the emission area EA, and the red, green, blue and white subpixels R-SP, G-SP, B-SP and W-SP constitute a single unit pixel P.

The light emitting diode E (of FIG. 3) is disposed in the emission area EA of each of the red, green, blue and white subpixels R-SP, G-SP, B-SP and W-SP, and the switching TFT Tsw and the driving TFT Tdr are disposed under the light emitting diode E.

A source electrode of the driving TFT Tdr is connected to the power line PL, and a drain electrode of the driving TFT Tdr is connected to an anode ANO of the light emitting diode E. A gate electrode of the driving TFT Tdr is connected to a drain electrode of the switching TFT Tsw. A gate electrode of the switching TFT Tsw is connected to the gate line GL, and a source electrode of the switching TFT Tsw is connected to the data line DL.

The anode ANO of the light emitting diode E is connected to the drain electrode 109b of the driving TFT Tdr, and the storage capacitor Cst is connected to the gate electrode of the driving TFT Tdr and the anode ANO of the light emitting diode E.

As a result, when the gate signal is applied through the gate line GL, the switching TFT Tsw is turned on and the data signal through the switching TFT Tsw is supplied to the gate electrode of the driving TFT Tdr so that the driving TFT Tdr can be turned on. When the driving TFT Tdr is turned on, a driving current through the power line PL is applied to the light emitting diode E so that the light emitting diode E can emit a light.

For an external compensation, the sense line SL is disposed along a same direction as the gate line GL, and the sensing TFT Tse switched according to a sense signal applied to the sense line SL is connected to the sense line SL.

A signal supplied to the light emitting diode E is detected by switching the sensing TFT Tse. The data signal supplied to the red, green, blue and white subpixels R-SP, G-SP, B-SP and W-SP is modulated according to the signal detected in the red, green, blue and white subpixels R-SP, G-SP, B-SP and W-SP so that a change of a threshold voltage and a mobility of the driving TFT Tdr can be compensated.

An array test is performed for the OLED display device 100. In the array test, deterioration of an electric property of the switching and driving TFTs Tsw and Tdr and the gate, data, power and reference lines may be detected.

Specifically, deterioration such as an electric open of a conductive line connecting the drain electrode of the driving TFT Tdr and the anode ANO of the light emitting diode E may occur. Since the drain electrode of the driving TFT Tdr and the anode ANO of the light emitting diode E are formed as different metal layers contacting each other, the drain electrode of the driving TFT Tdr and the anode ANO of the light emitting diode E may be over-etched in a subsequent etching process due to a step difference of a lower layer.

The array test may be performed for the substrate 101 where the gate, data, power and reference lines GL, DL, PL and RL, the switching and driving TFTs Tsw and Tdr and the anode ANO are formed.

In the OLED display device 100 according to a first embodiment of the present disclosure, the anode ANO of the light emitting diode E has a double layered structure including a first anode 210 having a relatively small area and a second anode 220 having an area corresponding to the emission area EA of each of the red, green, blue and white subpixels R-SP, G-SP, B-SP and W-SP.

As a result, when deterioration of the switching and driving TFTs Tsw and Tdr and the gate, data, power and reference lines GL, DL, PL and RL is detected in the array test, a repair process may be easily performed due to the double layer structure and an aperture ratio may be improved due to enlargement of the emission area EA.

In the process of fabricating the light emitting diode E and the switching and driving TFTs Tsw and Tdr in each of the red, green, blue and white subpixels R-SP, G-SP, B-SP and W-SP of the OLED display device 100, each of the red, green, blue and white subpixels R-SP, G-SP, B-SP and W-SP may be abnormally driven due to deterioration of a property of the switching and driving TFTs Tsw and Tdr and electric shortage or open between the gate, data, power and reference lines GL, DL, PL and RL and other layers.

Specifically, the conductive line connecting the drain electrode of the driving TFT Tdr and the anode ANO of the light emitting diode E may have an electric open.

The deterioration such as an electric shortage or an electric open may cause a dark point or a bright point of the red, green, blue and white subpixels R-SP, G-SP, B-SP and W-SP. When one of the red, green, blue and white subpixels R-SP, G-SP, B-SP and W-SP has a dark point or a bright point, a repair process is performed.

The repair process may be performed through various methods such that the drain electrode of the driving TFT Tdr is connected to an auxiliary power line in the one of the red, green, blue and white subpixels R-SP, G-SP, B-SP and W-SP having a dark point or a bright point, or a connection point of the driving TFT Tdr and the anode ANO of the light emitting diode E is cut with a laser.

In FIG. 2A, after the first anode 210 having a relatively small area is formed in the emission area EA of each of the red, green, blue and white subpixels R-SP, G-SP, B-SP and W-SP, the array test is performed.

When the one of the red, green, blue and white subpixels R-SP, G-SP, B-SP and W-SP having deterioration is detected in the array test, the repair process is immediately performed.

Since the first anode 210 is formed to have a relatively small area in the emission area EA, all of the switching and driving TFTs Tsw and Tdr and the gate, data, power and reference lines GL, DL, PL and RL in the red, green, blue and white subpixels R-SP, G-SP, B-SP and W-SP are substantially exposed outside the first anode 210.

Accordingly, the repair process for the switching and driving TFTs Tsw and Tdr and the gate, data, power and reference lines GL, DL, PL and RL having deterioration is easily performed.

The first anode 210 may have an area for the array test. For example, the first anode 210 may have an area of about 20 μm*20 μm to about 30 μm*30 μm and may have a horizontal length and a vertical length of about 20 μm to about 30 μm.

In the array test, as the area of the anode ANO increases, detection ability is improved. As a result, the first anode 210 may have a maximum area satisfying that all of the switching and driving TFTs Tsw and Tdr and the gate, data, power and reference lines GL, DL, PL and RL under the first node 210 are substantially exposed outside the first anode 210.

The first anode 210 may include a transparent conductive material such as indium tin oxide (ITO) and indium zinc oxide (IZO). Since the first anode 210 has a relatively small area, a resistance of the first anode 210 is reduced by crystallizing the first anode 210 through a heat treatment of about 230° C. As a result, a reliability of the array test result is improved.

In FIG. 2B, after the repair process is completed, the second anode 220 is formed on the first anode 210 to correspond to the emission area EA of each of the red, green, blue and white subpixels R-SP, G-SP, B-SP and W-SP.

Since the second anode 220 is disposed to correspond to the emission area EA of each of the red, green, blue and white subpixels R-SP, G-SP, B-SP and W-SP, the emission area EA are further enlarged and the aperture ratio is improved.

In a top emission type organic light emitting diode display device of a comparison example where an anode has an area corresponding to an emission area of each of red, green, blue and white subpixels, an array test is performed after the anode is formed. Since switching and driving thin film transistors and gate, data, power and reference lines of red, green, blue and white subpixels having deterioration are disposed under the anode, it is difficult to perform a repair process.

As a result, an additional repair region where the anode is not disposed is required in each of the red, green, blue and white subpixels, and the emission area of each of the red, green, blue and white subpixels is reduced such that an aperture ratio is reduced.

In the OLED display device 100 according to a first embodiment of the present disclosure, the array test is performed through the first anode 210 having a relatively small area such that all of the switching and driving TFTs Tsw and Tdr and the gate, data, power and reference lines GL, DL, PL and RL are substantially exposed outside the first anode 210 in the red, green, blue and white subpixels R-SP, G-SP, B-SP and W-SP having deterioration. As a result, the repair process is easily performed and an additional repair region is not required.

In addition, since the second anode 220 is formed to correspond to a whole of the emission area EA of each of the red, green, blue and white subpixels R-SP, G-SP, B-SP and W-SP, reduction of the emission area EA of each of the red, green, blue and white subpixels R-SP, G-SP, B-SP and W-SP due to an additional repair region is prevented.

Accordingly, the OLED display device 100 having an improved aperture ratio is provided.

FIG. 3 is a cross-sectional view showing a subpixel of an organic light emitting diode display device according to a first embodiment of the present disclosure. FIG. 3 shows a cross-sectional view taken along a line II-IF of FIG. 2B.

In FIG. 3, a semiconductor layer 103 of the driving TFT Tdr is disposed on the substrate 101. The semiconductor layer 103 may include one of a silicon semiconductor material, an oxide semiconductor material and an organic semiconductor material. The silicon semiconductor material may include amorphous silicon or polycrystalline silicon crystallized from amorphous silicon. The oxide semiconductor material may include one of zinc oxide (ZnO), indium zinc oxide (InZnO), indium gallium zinc oxide (InGaZnO) and zinc tin oxide (ZnSnO).

The organic semiconductor material may include an organic material of a small molecule group or a polymer group such as merocyanine, phthalocyanine, pentacene and thiophene polymer.

The semiconductor layer 103 includes a drain region 103c and a source region 103b having an impurity of a positive (p) type or a negative (n) type and a channel region 103a therebetween.

A gate insulating layer 105 is disposed on the semiconductor layer 103. The gate insulating layer 105 may have a single layer of silicon oxide (SiOx) or silicon nitride (SiNx) or a multiple layer thereof. A gate electrode 107 is disposed on the gate insulating layer 105 over the channel region 103a of the semiconductor layer 103 having an impurity.

The gate electrode 107 may include one of molybdenum (Mo), aluminum (Al), chromium (Cr), gold (Au), titanium (Ti), nickel (Ni), neodymium (Nd) and copper (Cu) or an alloy thereof. The gate electrode 107 may have a multiple layer of one of molybdenum (Mo), aluminum (Al), chromium (Cr), gold (Au), titanium (Ti), nickel (Ni), neodymium (Nd) and copper (Cu) or an alloy thereof. For example, the gate electrode 107 may have a double layer of molybdenum/aluminum-neodymium or molybdenum/aluminum.

An interlayer insulating layer 106 is disposed on the gate electrode 107. The interlayer insulating layer 106 may include one of silicon oxide (SiOx) and silicon nitride (SiNx) or a multiple layer thereof.

A source electrode 109a and a drain electrode 109b are disposed on the interlayer insulating layer 106. The source electrode 109a and the drain electrode 109b are connected to the source region 103b and the drain region 103c, respectively, of the semiconductor layer 103 through semiconductor contact holes CH of the interlayer insulating layer 106 and the gate insulating layer 105.

The source electrode 109a and the drain electrode 109b may have a single layer or a multiple layer. When the source electrode 109a and the drain electrode 109b have a single layer, the source electrode 109a and the drain electrode 109b may include one of molybdenum (Mo), aluminum (Al), chromium (Cr), titanium (Ti), nickel (Ni), neodymium (Nd) and copper (Cu) or an alloy thereof. When the source electrode 109a and the drain electrode 109b have a multiple layer, the source electrode 109a and the drain electrode 109b may have a double layer of molybdenum/aluminum-neodymium or a triple layer of one of titanium/aluminum/titanium, molybdenum/aluminum/molybdenum and molybdenum/aluminum-neodymium/molybdenum.

The semiconductor layer 103, the gate electrode 107, the source electrode 109a and the drain electrode 109b constitute the driving TFT Tdr.

A light shielding layer may be disposed under the semiconductor layer 103. The light shielding layer may block an external light to prevent an optical current from being generated in the driving TFT Tdr.

The light shielding layer may be electrically connected to one of the source electrode 109a and the drain electrode 109b of the driving TFT Tdr. As a result, it is prevented that a potential of the light shielding layer is changed during an operation of the OLED display device 100 or a threshold voltage of the driving TFT Tdr is influenced by the light shielding layer.

A buffer layer may be further disposed on the light shielding layer.

An overcoat layer 108 is disposed on the driving TFT Tdr of the substrate 101. The overcoat layer 108 may be a planarizing layer for protecting lower elements and alleviating a step difference of a lower structure and may include an organic material such as polyimide, benzocyclobutene series resin and acrylate.

The overcoat layer 108 have a drain contact hole PH exposing the drain electrode 109b of the driving TFT Tdr, and the anode ANO connected to the drain electrode 109b of the driving TFT Tdr through the drain contact hole PH is disposed on the overcoat layer 108.

The anode ANO includes the first anode 210 directly contacting the drain electrode 109b through the drain contact hole PH and the second anode 220 covering the first anode 210.

The first anode 210 covers the drain contact hole PH and may have a relatively small area for the array test. For example, the first anode 210 may have a horizontal length of about 20 μm to about 30 μm and a vertical length of about 20 μm to about 30 μm.

The first anode 210 may include a transparent conductive material such as indium tin oxide (ITO) and indium zinc oxide (IZO) and may be crystallized to have a polycrystalline structure for improving a reliability of the result of the array test.

The second anode 220 covering and directly contacting the first anode 210 is disposed to correspond to the emission area EA of each of the red, green, blue and white subpixels R-SP, G-SP, B-SP and W-SP. The second anode 220 constitutes an anode of the light emitting diode E.

The second anode 220 is disposed in each of the red, green, blue and white subpixels R-SP, G-SP, B-SP and W-SP, and a bank 119 is disposed between the second anodes 220 of the adjacent subpixels. The second anode 220 is divided into each of the red, green, blue and white subpixels R-SP, G-SP, B-SP and W-SP using the bank 119 as a border of each of the red, green, blue and white subpixels R-SP, G-SP, B-SP and W-SP.

The second anode 220 may include a metallic material having a relatively high reflectance such as a multiple layer of aluminum and titanium (Ti/Al/Ti), a multiple layer of aluminum and indium tin oxide (ITO/Al/ITO), an APC alloy (Ag/Pd/Cu) and a multiple layer of an APC alloy and ITO (ITO/APC/ITO).

An organic emitting layer EML is disposed on the second anode 220. The organic emitting layer EML may have a single layer of an emitting material or a multiple layer of a hole injecting layer, a hole transporting layer, an emitting material layer, an electron transporting layer and an electron injecting layer.

A cathode CAT is disposed on a whole of the organic emitting layer EML. The cathode CAT may include a material having a relatively low work function.

The anode ANO, the organic emitting layer EML and the cathode CAT constitute the light emitting diode E.

When a voltage is applied to the anode ANO including the first and second anodes 210 and 220 and the cathode CAT, a hole injected from the anode ANO and an electron injected from the cathode CAT are transported into the organic emitting layer EML to constitute an exciton. When the exciton transitions from an excited state to a ground state, a light is generated to be emitted as a visible ray.

The OLED display device 100 according to a first embodiment of the present disclosure has a top emission type, where a light emitted from the organic emitting layer EML passes through the cathode CAT to an exterior and the OLED display device 100 displays an image.

Since the switching TFT Tsw and the driving TFT Tdr are disposed under the bank 119 and the anode ANO in the top emission type, the top emission type has advantages that the switching TFT Tsw and the driving TFT Tdr have a relatively large design area as compared with a bottom emission type.

A sealing layer 104 of a thin film shape and an encapsulating substrate 102 are sequentially disposed on the switching TFT Tsw, the driving TFT Tdr and the light emitting diode E. The sealing layer 104 and the encapsulating substrate 102 prevent a moisture from penetrating into each of the red, green, blue and white subpixels R-SP, G-SP, B-SP and W-SP to protect the organic emitting layer EML vulnerable to a moisture or an oxygen of an exterior.

In the OLED display device 100 according to a first embodiment of the present disclosure, the anode ANO of the light emitting diode E has the double layer including the first anode 210 having a relatively small area for the array test and the second anode 220 having an area corresponding to the emission area EA of each of the red, green, blue and white subpixels R-SP, G-SP, B-SP and W-SP.

As a result, a reliability of the array test is improved, and the repair process for one of the red, green, blue and white subpixels R-SP, G-SP, B-SP and W-SP having deterioration is easily performed.

Specifically, the emission area EA is enlarged and an aperture ratio increases to obtain a relatively high resolution with improvement of the reliability and the repair process.

Figure 4A:
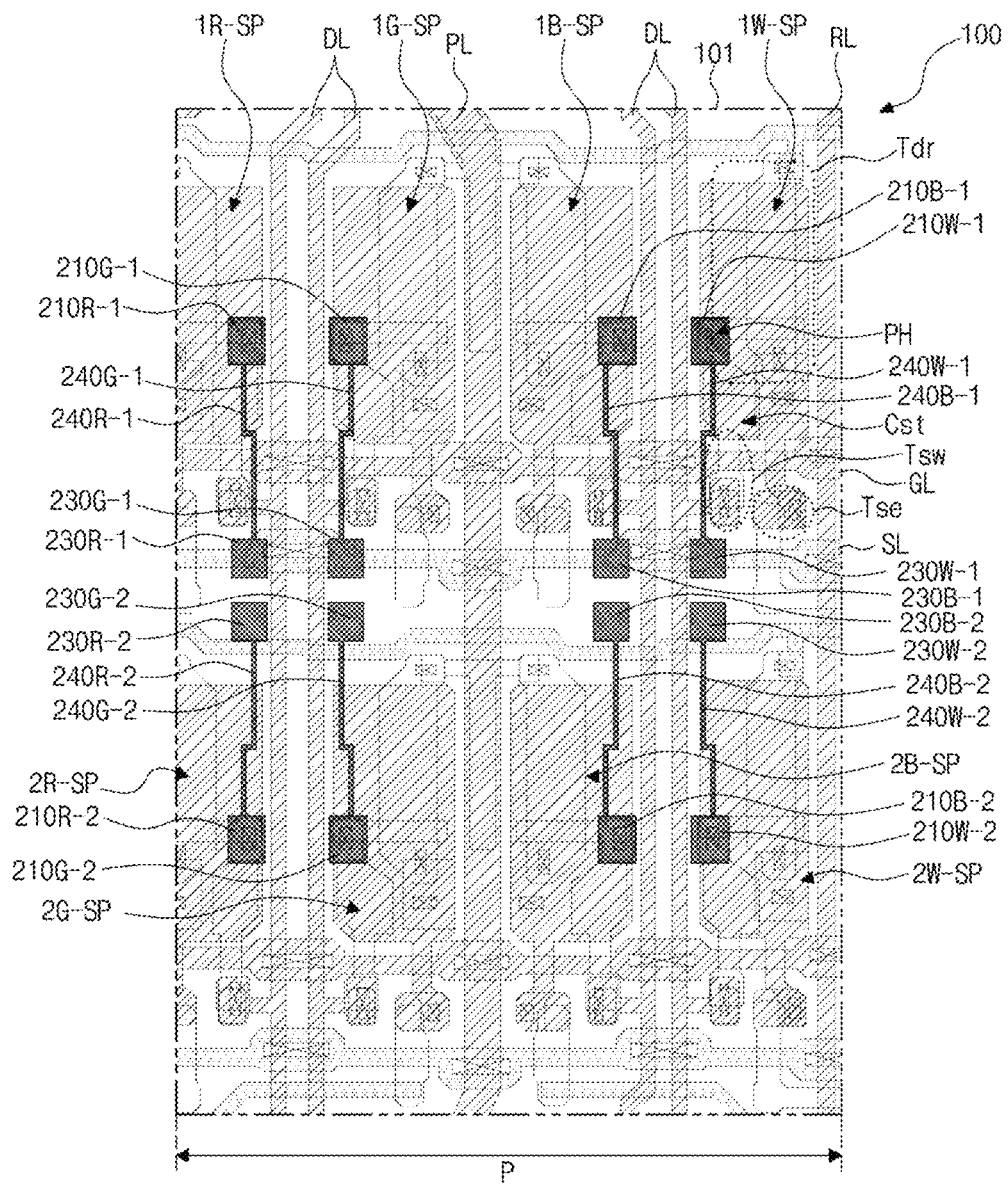
FIGS. 4A and 4B are plan views showing subpixels of an organic light emitting diode display device according to a second embodiment of the present disclosure.
Figure 4B:
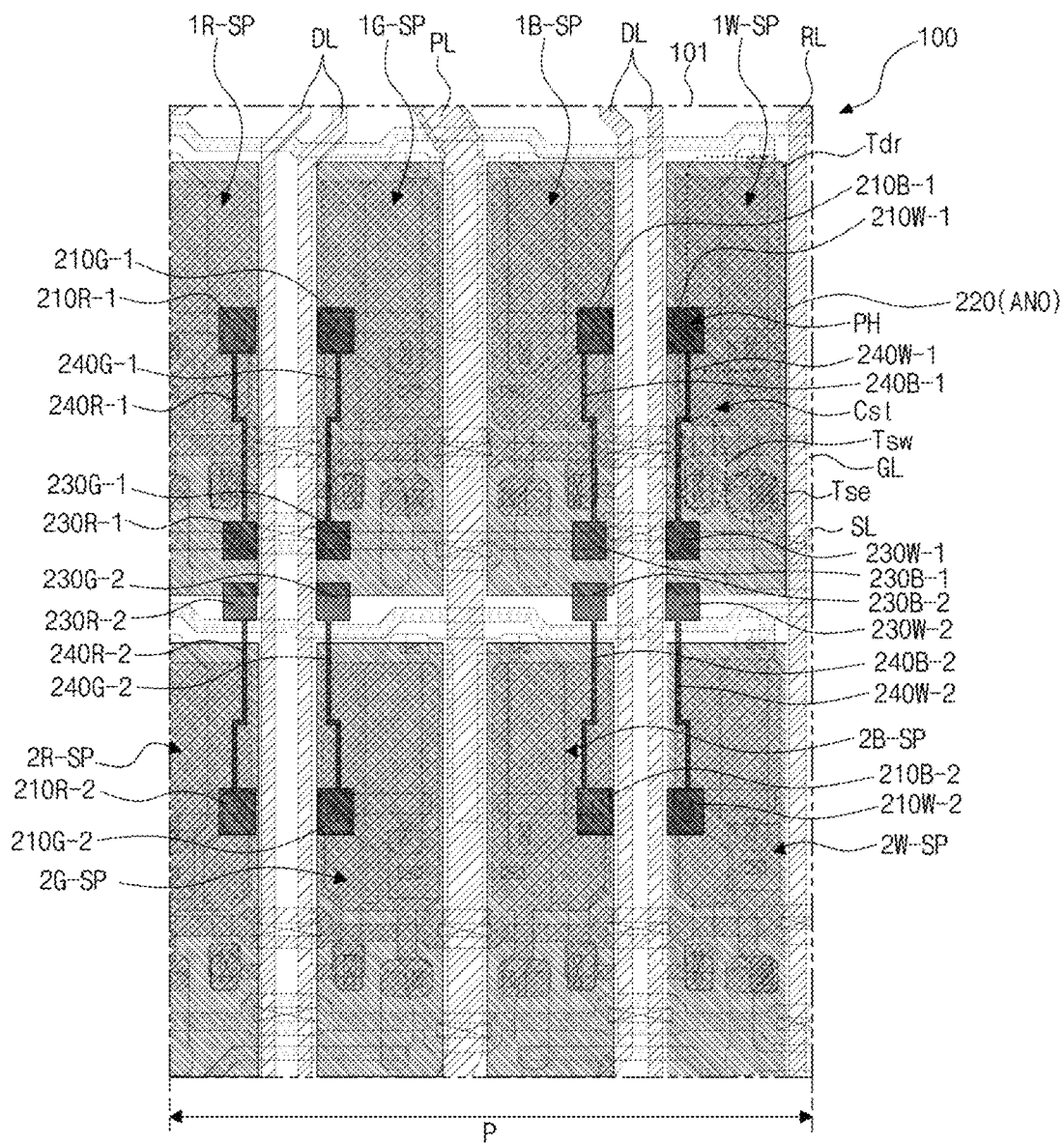

FIGS. 4A and 4B are plan views showing subpixels of an organic light emitting diode display device according to a second embodiment of the present disclosure. FIG. 4A shows subpixels after a first anode is formed and FIG. 4B shows subpixels after first and second anodes are formed.

A part of the second embodiment the same as the first embodiment will have the same reference number, and illustration on a part of the second embodiment the same as the first embodiment will be omitted.

In FIG. 4A, a light emitting diode E (of FIG. 3) and a driving circuit driving the light emitting diode E are disposed in each of red, green, blue and white subpixels R-SP, G-SP, B-SP and W-SP on a substrate 101.

In addition, a plurality of signal lines for supplying a driving power and a signal to the light emitting diode E and the driving circuit are disposed on the substrate 101.

The driving circuit includes a switching TFT Tsw, a sensing TFT Tse, a driving TFT Tdr and a storage capacitor Cst, and the plurality of signal lines include a data line DL, a gate line GL, a power line PL, a sense line SL and a reference line RL.

The power line PL, the reference line RL and the data line DL are disposed along a vertical direction, and the gate line GL is disposed along a horizontal direction. The data line DL and the gate line GL cross each other to define an emission area EA. Each of the red, green, blue and white subpixels R-SP, G-SP, B-SP and W-SP has the emission area EA, and the red, green, blue and white subpixels R-SP, G-SP, B-SP and W-SP constitute a single unit pixel P.

The light emitting diode E (of FIG. 3) is disposed in the emission area EA of each of the red, green, blue and white subpixels R-SP, G-SP, B-SP and W-SP, and the switching TFT Tsw and the driving TFT Tdr are disposed under the light emitting diode E.

A source electrode of the driving TFT Tdr is connected to the power line PL, and a drain electrode of the driving TFT Tdr is connected to an anode ANO of the light emitting diode E. A gate electrode of the driving TFT Tdr is connected to a drain electrode of the switching TFT Tsw. A gate electrode of the switching TFT Tsw is connected to the gate line GL, and a source electrode of the switching TFT Tsw is connected to the data line DL.

The anode ANO of the light emitting diode E is connected to the drain electrode 109b of the driving TFT Tdr, and the storage capacitor Cst is connected to the gate electrode of the driving TFT Tdr and the anode ANO of the light emitting diode E.

In an organic light emitting diode (OLED) display device 100 according to a second embodiment of the present disclosure, the anode ANO of the light emitting diode E has a double layered structure including a first anode 210R-1, 210R-2, 210G-1, 210G-2, 210B-1, 210B-2, 210W-1 and 210W-2 having a relatively small area and a second anode 220 having an area corresponding to the emission area EA of each of the red, green, blue and white subpixels R-SP, G-SP, B-SP and W-SP.

In FIG. 4A, the first anode 210R-1, 210R-2, 210G-1, 210G-2, 210B-1, 210B-2, 210W-1 and 210W-2 may have an area for the array test. For example, the first anode 210R-1, 210R-2, 210G-1, 210G-2, 210B-1, 210B-2, 210W-1 and 210W-2 may have an area of about 20 μm*20 μm to about 30 μm*30 μm and may have a horizontal length and a vertical length of about 20 μm to about 30 μm.

In the array test, as the area of the anode ANO increases, detection ability is improved. As a result, the first anode 210R-1, 210R-2, 210G-1, 210G-2, 210B-1, 210B-2, 210W-1 and 210W-2 may have a maximum area satisfying that all of the switching and driving TFTs Tsw and Tdr and the gate, data, power and reference lines GL, DL, PL and RL under the first anode 210R-1, 210R-2, 210G-1, 210G-2, 210B-1, 210B-2, 210W-1 and 210W-2 are substantially exposed outside the first anode 210R-1, 210R-2, 210G-1, 210G-2, 210B-1, 210B-2, 210W-1 and 210W-2.

The first anode 210R-1, 210R-2, 210G-1, 210G-2, 210B-1, 210B-2, 210W-1 and 210W-2 may include a transparent conductive material such as indium tin oxide (ITO) and indium zinc oxide (IZO). Since the first anode 210R-1, 210R-2, 210G-1, 210G-2, 210B-1, 210B-2, 210W-1 and 210W-2 has a relatively small area, a resistance of the first anode 210R-1, 210R-2, 210G-1, 210G-2, 210B-1, 210B-2, 210W-1 and 210W-2 is reduced by crystallizing the first anode 210R-1, 210R-2, 210G-1, 210G-2, 210B-1, 210B-2, 210W-1 and 210W-2 through a heat treatment of about 230° C. As a result, a reliability of the array test result is improved.

In the OLED display device 100 according to a second embodiment of the present disclosure, after the first anode 210R-1, 210R-2, 210G-1, 210G-2, 210B-1, 210B-2, 210W-1 and 210W-2 having a relatively small area is formed in the emission area EA of each of the red, green, blue and white subpixels R-SP, G-SP, B-SP and W-SP, the array test is performed. When the one of the red, green, blue and white subpixels R-SP, G-SP, B-SP and W-SP having deterioration is detected in the array test, the repair process is immediately performed through the switching and driving TFTs Tsw and Tdr and the gate, data, power and reference lines GL, DL, PL and RL exposed outside the first anode 210R-1, 210R-2, 210G-1, 210G-2, 210B-1, 210B-2, 210W-1 and 210W-2 in the red, green, blue and white subpixels R-SP, G-SP, B-SP and W-SP.

In FIG. 4B, after the repair process is completed, the second anode 220 is formed on the first anode 210R-1, 210R-2, 210G-1, 210G-2, 210B-1, 210B-2, 210W-1 and 210W-2 to correspond to the emission area EA of each of the red, green, blue and white subpixels R-SP, G-SP, B-SP and W-SP.

Since the second anode 220 is disposed to correspond to the emission area EA of each of the red, green, blue and white subpixels R-SP, G-SP, B-SP and W-SP, the emission area EA are further enlarged and the aperture ratio is improved.

In the OLED display device 100 according to a second embodiment of the present disclosure, the first anode 210R-1, 210R-2, 210G-1, 210G-2, 210B-1, 210B-2, 210W-1 and 210W-2 is connected to a rendering electrode 230R-1, 230R-2, 230G-1, 230G-2, 230B-1, 230B-2, 230W-1 and 230W-2 through a bridge electrode 240R-1, 240R-2, 240G-1, 240G-2, 240B-1, 240B-2, 240W-1 and 240W-2.

The bridge electrode 240R-1, 240R-2, 240G-1, 240G-2, 240B-1, 240B-2, 240W-1 and 240W-2 and the rendering electrode 230R-1, 230R-2, 230G-1, 230G-2, 230B-1, 230B-2, 230W-1 and 230W-2 have the same material and the same layer as the first anode 210R-1, 210R-2, 210G-1, 210G-2, 210B-1, 210B-2, 210W-1 and 210W-2. The rendering electrode 230R-1, 230R-2, 230G-1, 230G-2, 230B-1, 230B-2, 230W-1 and 230W-2 is disposed in a border region of each of the red, green, blue and white subpixels R-SP, G-SP, B-SP and W-SP adjacent to the subpixel R-SP, G-SP, B-SP and W-SP emitting the same color.

The red, green, blue and white subpixels R-SP, G-SP, B-SP and W-SP are alternately disposed along a horizontal direction. The plurality of red subpixels R-SP, the plurality of green subpixels G-SP, the plurality of blue subpixels B-SP and the plurality of white subpixels W-SP are disposed along a vertical direction in a stripe type.

For example, a first red rendering electrode 230R-1 in a first red subpixel 1R-SP of a first row is disposed adjacent to a second red subpixel 2R-SP of a second row, and a first red bridge electrode 240R-1 is disposed between a first-first red anode 210R-1 and the first red rendering electrode 230R-1 in the first red subpixel 1R-SP.

A second red rendering electrode 230R-2 in the second red subpixel 2R-SP is disposed adjacent to the first red subpixel 1R-SP, and a second red bridge electrode 240R-2 is disposed between a first-second red anode 210R-2 and the second red rendering electrode 230R-2 in the second red subpixel 2R-SP.

First and second green subpixels 1G-SP and 2G-SP, first and second blue subpixels 1B-SP and 2B-SP, and first and second white subpixels 1W-SP and 2W-SP of the first and second rows are disposed similarly to the first and second red subpixels 1R-SP and 2R-SP. A first green rendering electrode 230G-1 in the first green subpixel 1G-SP of the first row and a second green rendering electrode 230G-2 in the second green subpixel 2G-SP of the second row are disposed adjacent to each other in neighboring regions of the first and second green subpixels 1G-SP and 2G-SP. A first green rendering electrode 230G-1 is connected to a first-first green anode 210G-1 through a first green bridge electrode 240G-1, and a second green rendering electrode 230G-2 is connected to a first-second green anode 210G-2 through a second green bridge electrode 240G-2.

A first blue rendering electrode 230B-1 in the first blue subpixel 1B-SP of the first row and a second blue rendering electrode 230B-2 in the second blue subpixel 2B-SP of the second row are disposed adjacent to each other in neighboring regions of the first and second blue subpixels 1B-SP and 2B-SP. A first blue rendering electrode 230B-1 is connected to a first-first blue anode 210B-1 through a first blue bridge electrode 240B-1, and a second blue rendering electrode 230B-2 is connected to a first-second blue anode 210B-2 through a second blue bridge electrode 240B-2.

A first white rendering electrode 230W-1 in the first white subpixel 1W-SP of the first row and a second white rendering electrode 230W-2 in the second white subpixel 2W-SP of the second row are disposed adjacent to each other in neighboring regions of the first and second white subpixels 1W-SP and 2W-SP. A first white rendering electrode 230W-1 is connected to a first-first white anode 210W-1 through a first white bridge electrode 240W-1, and a second white rendering electrode 230W-2 is connected to a first-second white anode 210W-2 through a second white bridge electrode 240W-2.

In the OLED display device 100 according to a second embodiment of the present disclosure, since the red, green, blue and white subpixels R-SP, G-SP, B-SP and W-SP having deterioration may be driven through the adjacent red, green, blue and white subpixels R-SP, G-SP, B-SP and W-SP, a dark point or a bright point of the red, green, blue and white subpixels R-SP, G-SP, B-SP and W-SP having deterioration is prevented.

As a result, a fabrication yield is improved and a fabrication cost is reduced.

In the OLED display device 100 according to a second embodiment of the present disclosure, after a signal inputted to the red, green, blue and white subpixels R-SP, G-SP, B-SP and W-SP having deterioration through the rendering electrode 230R-1, 230R-2, 230G-1, 230G-2, 230B-1, 230B-2, 230W-1 and 230W-2 and the bridge electrode 240R-1, 240R-2, 240G-1, 240G-2, 240B-1, 240B-2, 240W-1 and 240W-2 is blocked, another signal inputted to the adjacent red, green, blue and white subpixels R-SP, G-SP, B-SP and W-SP is supplied to the red, green, blue and white subpixels R-SP, G-SP, B-SP and W-SP having deterioration.

As a result, a dark point or a bright point of the red, green, blue and white subpixels R-SP, G-SP, B-SP and W-SP having deterioration is repaired.

Since a dark point or a bright point of the red, green, blue and white subpixels R-SP, G-SP, B-SP and W-SP having deterioration is prevented, a fabrication yield of the OLED display device 100 is improved and a fabrication cost of the OLED display device 100 is reduced.

FIGS. 5A to 5E are cross-sectional views showing a repair process of an organic light emitting diode display device according to a second embodiment of the present disclosure.

For convenience of illustration, first and second red subpixels 1R-SP and 2R-SP are exemplarily shown in FIGS. 5A to 5E.

Figure 5A:
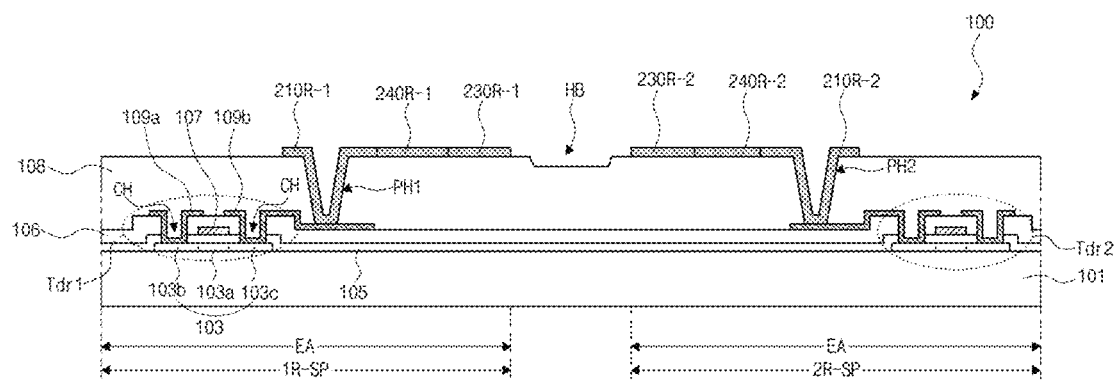
FIGS. 5A to 5E are cross-sectional views showing a repair process of an organic light emitting diode display device according to a second embodiment of the present disclosure.

In FIG. 5A, the semiconductor layer 103 of a first driving TFT Tdr1 is disposed in the first red subpixel 1R-SP on the substrate 101. The semiconductor layer 103 includes the source region 103b and the drain region 103c having an impurity of a positive (p) type or a negative (n) type and a channel region 103a therebetween.

The gate insulating layer 105 is disposed on the semiconductor layer 103, and the gate electrode 107 is disposed on the gate insulating layer 105 over the channel region 103a of the semiconductor layer 103 having an impurity.

The interlayer insulating layer 106 is disposed on the gate electrode 107, and the source electrode 109a and the drain electrode 109b are disposed on the interlayer insulating layer 106. The source electrode 109a and the drain electrode 109b are connected to the semiconductor layer 103 through the semiconductor contact holes CH exposing the source region 103b and the drain region 103c.

The semiconductor layer 103, the gate electrode 107, the source electrode 109a and the drain electrode 109b constitute the first driving TFT Tdr1.

The second red subpixel 2R-SP is disposed adjacent to the first red subpixel 1R-SP and includes a second driving TFT Tdr2 the same as the first driving TFT Tdr1.

The overcoat layer is disposed on the first and second driving TFTs Tdr1 and Tdr2 of the substrate 101.

The overcoat layer 108 have first and second drain contact holes PH1 and PH2 exposing the drain electrodes 109b of the first and second driving TFTs Tdr1 and Tdr2, and first-first and first-second red anodes 201R-1 and 210R-2 connected to the drain electrodes 109b of the first and second driving TFTs Tdr1 and Tdr2 through the first and second drain contact holes PH1 and PH2 are disposed on the overcoat layer 108.

The first-first and first-second red anodes 210R-1 and 210R-2 cover the first and second drain contact holes PH1 and PH2, respectively, and each of the first-first and first-second red anodes 210R-1 and 210R-2 may have a horizontal length of about 20 μm to about 30 μm and a vertical length of about 20 μm to about 30 μm for the array test.

The first-first and first-second red anodes 210R-1 and 210R-2 may include a transparent conductive material such as indium tin oxide (ITO) and indium zinc oxide (IZO) and may be crystallized to have a polycrystalline structure for improving a reliability of the result of the array test.

A first red rendering electrode 230R-1 is connected to the first-first red anode 210R-1 through a first red bridge electrode 240R-1, and a second red rendering electrode 230R-2 is connected to the first-second red anode 210R-2 through a second red bridge electrode 240R-2.

The first red rendering electrode 230R-1 and the second red rendering electrode 230R-2 are disposed adjacent to each other.

A groove HB is disposed in the overcoat layer 108 between the first red rendering electrode 230R-1 and the second red rendering electrode 230R-2.

The groove HB of the overcoat layer 108 has a concave shape toward the substrate 101 for planarizing a metal ink pattern 250 (of FIG. 5C) between the first red rendering electrode 230R-1 and the second red rendering electrode 230R-2.

The array test is performed to the substrate 101 where the first-first red anode 210R-1 and the first-second red anode 210R-2 are formed.

Figure 5B:
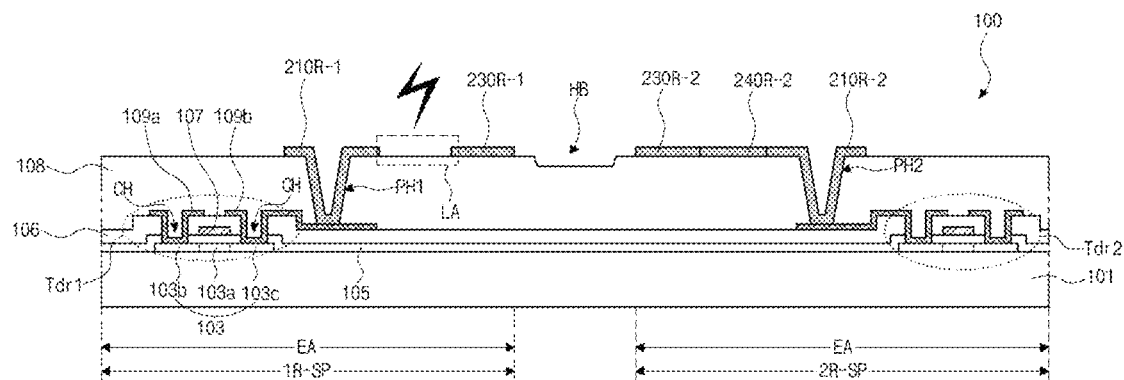

In FIG. 5B, when deterioration of the first red subpixel 1R-SP is detected in the array test, the first red bridge electrode 240R-1 between the first-first red anode 210R-1 and the first red rendering electrode 230R-1 of the first red subpixel 1R-SP is removed using a laser to form a laser cutting area LA where the overcoat layer 108 is exposed. As a result, a current path is blocked.

Figure 5C:
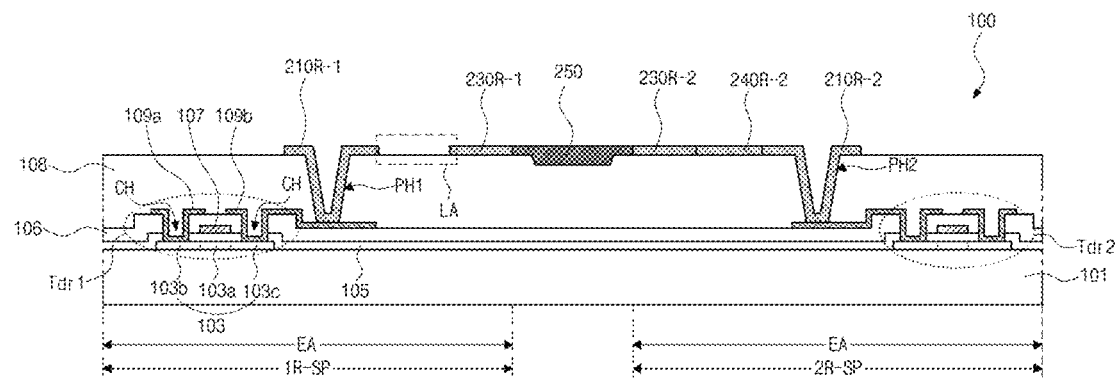

In FIG. 5C, a metal ink pattern 250 is formed between the first red rendering electrode 230R-1 of the first red subpixel 1R-SP and the second red rendering electrode 230R-2 of the second red subpixel 2R-SP. As a result, the first red rendering electrode 230R-1 and the second red rendering electrode 230R-2 are connected to each other through the metal ink pattern 250.

Since the metal ink pattern 250 is disposed to correspond to the groove HB of the overcoat layer 108, the metal ink pattern 250 is planarized due to the groove HB to have a flat top surface.

Figure 5D:
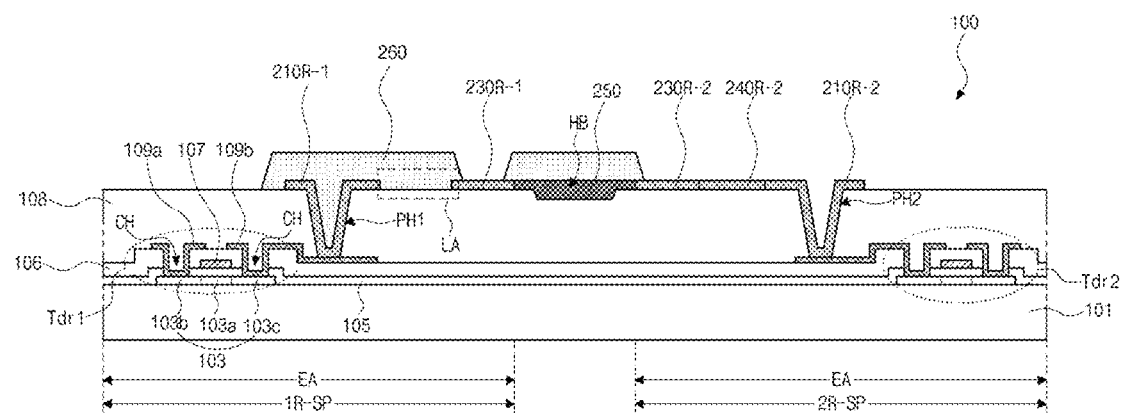

In FIG. 5D, a barrier layer 260 is disposed on the first-first red anode 210R-1, the first red rendering electrode 230R-1, the metal ink pattern 250 and the second red rendering electrode 230R-2. The barrier layer 260 may completely cover the first-first red anode 210R-1 and the metal ink pattern 250 and may cover a portion of the first red bridge electrode 240R-1 remaining in the laser cutting area LA, a portion of the first red rendering electrode 230R-1 and a portion of the second red rendering electrode 230R-2. The barrier layer 260 may expose the first red rendering electrode 230R-1.

Figure 5E:
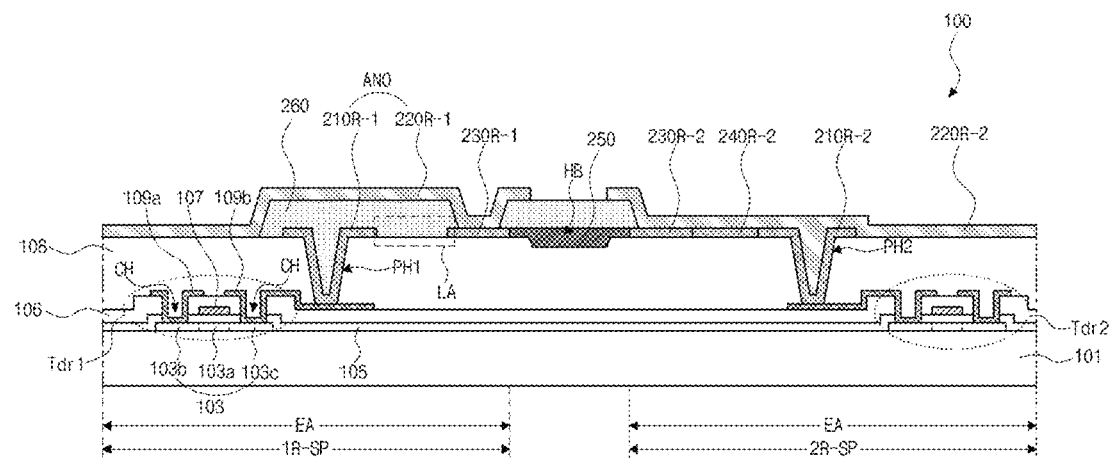

In FIG. 5E, a second-first red anode 220R-1 is disposed on the barrier layer 260 to correspond to the emission area EA of the first red subpixel 1R-SP, and a second-second red anode 220R-2 is disposed on the first-second red anode 210R-2, the second red rendering electrode 230R-2 and the second red bridge electrode 240R-2 to correspond to the emission area EA of the second red subpixel 2R-SP.

The second-first and second-second red anodes 220R-1 and 220R-2 are disposed in the first and second red subpixels 1R-SP and 2R-SP, respectively. The second-first and second-second red anodes 220R-1 and 220R-2 may include a metallic material having a relatively high reflectance such as a multiple layer of aluminum and titanium (Ti/Al/Ti), a multiple layer of aluminum and indium tin oxide (ITO/Al/ITO), an APC alloy (Ag/Pd/Cu) and a multiple layer of an APC alloy and ITO (ITO/APC/ITO).

The second-second red anode 220R-2 is disposed on the first-second red anode 210R-2, the second red bridge electrode 240R-2 and the second red rendering electrode 230R-2 to cover and directly contact the first-second red anode 210R-2, the second red bridge electrode 240R-2 and the second red rendering electrode 230R-2.

The second-first red anode 220R-1 is disposed on the first red rendering electrode 230R-1 to cover and directly contact the first red rendering electrode 230R-1.

Since the second-first red anode 220R-1 is connected to the second-second red anode 220R-2 through the first red rendering electrode 230R-1, the signal applied to the first-second red anode 210R-2 and the second-second red anode 220R-2 of the second red subpixel 2R-SP is transmitted to the second-first red anode 220R-1 through the first red rendering electrode 230R-1.

The repair process of the OLED display device 100 according to a second embodiment of the present disclosure is completed through the steps of FIGS. 5A to 5E.

In the OLED display device 100 according to a second embodiment of the present disclosure, after the signal inputted to the first red subpixel 1R-SP having deterioration is blocked, the other signal inputted to the adjacent second red subpixel 2R-SP is transmitted to the first red subpixel 1R-SP having deterioration. As a result, the first and second red subpixels 1R-SP and 2R-SP are driven at the same time.

Even when the first red subpixel 1R-SP has deterioration, a dark point or a bright point of the first red subpixel 1R-SP is prevented. As a result, a fabrication yield of the OLED display device 100 is improved and a fabrication cost of the OLED display device 100 is reduced.

After the repair process is completed, the organic emitting layer EML (of FIG. 3) and the cathode CAT (of FIG. 3) are sequentially disposed on the second-first and second-second red anodes 220R-1 and 220R-2, and the sealing layer 104 (of FIG. 3) and the encapsulating substrate 102 (of FIG. 3) are sequentially disposed on the cathode CAT to complete a fabrication process of the OLED display device 100.

In the OLED display device 100 according to a second embodiment of the present disclosure, the anode ANO of the light emitting diode E has a double layered structure including the first anode 210R-1 and 210R-2 having a relatively small first area and the second anode 220R-1 and 220R-2 having a second area larger than the first area (for example, a second area corresponding to the emission area EA of each subpixel 1R-SP and 2R-SP). As a result, a reliability of the array test is improved and the repair process for the subpixel 1R-SP and 2R-SP is easily performed.

Specifically, the emission area EA is enlarged and an aperture ratio increases to obtain a relatively high resolution with improvement of the reliability and the repair process.

In addition, the bridge electrode 240R-1 and 240R-2 and the rendering electrode 230R-1 and 230R-2 are further connected to the first anode 210R-1 and 210R-2, and the subpixel 1R-SP and 2R-SP having deterioration is driven through the adjacent subpixel 1R-SP and 2R-SP. As a result, a dark point or a bright point of the subpixel 1R-SP and 2R-SP having deterioration is prevented. Further, a fabrication yield of the OLED display device 100 is improved and a fabrication cost of the OLED display device 100 is reduced.

Although the present disclosure is described herein in connection with an example in which the OLED display device 100 includes a red subpixel, a blue subpixel, a green subpixel, and a white subpixel, the OLED display device 100 may include more or fewer kinds of sub-pixels, for example, the OLED display device 100 may include only white sub-pixels.

It will be apparent to those skilled in the art that various modifications and variation can be made in the organic light emitting diode display device and the method of fabricating the same of the present disclosure without departing from the technical idea or scope of the disclosure. Thus, it is intended that the present disclosure cover the modifications and variations of this disclosure provided they come within the scope of the appended claims.

What is claimed is:
1. An organic light emitting diode display device, comprising:
 a substrate having first and second subpixels, each of the first and second subpixels having an emission area;
 a thin film transistor in each of the first and second subpixels;
 a first anode connected to the thin film transistor and having a first area; and
 a second anode having a second area greater than the first area,
 wherein the second anode is disposed on the first anode to cover the first anode.
2. The organic light emitting diode display device of claim 1, wherein the second area corresponds to the emission area.
3. The organic light emitting diode display device of claim 1, wherein the first anode has a horizontal length of 20 μm to 30 μm and a vertical length of 20 μm to 30 μm.
4. The organic light emitting diode display device of claim 1, wherein the thin film transistor is exposed outside the first anode.
5. The organic light emitting diode display device of claim 1, wherein the first anode is crystallized to have a polycrystalline structure.
6. The organic light emitting diode display device of claim 1, wherein the second anode contacts the first anode in one of the first and second subpixels having no deterioration.
7. The organic light emitting diode display device of claim 1, wherein the first and second subpixels emit a same colored light as each other,
 wherein the first anode includes a first-first anode in the first subpixel and a first-second anode in the second subpixel,
 wherein a first rendering electrode is connected to the first-first anode through a first bridge electrode in the first subpixel, and wherein a second rendering electrode is connected to the first-second anode through a second bridge electrode in the second subpixel.

8. The organic light emitting diode display device of claim 7, wherein the first and second rendering electrodes are disposed in neighboring regions of the first and second subpixels.

9. The organic light emitting diode display device of claim 7, wherein when the first subpixel has deterioration, the first bridge electrode is removed to form a laser cutting area and the first and second rendering electrodes are connected to each other through a metal ink pattern.

10. The organic light emitting diode display device of claim 9, wherein the second anode includes a second-first anode in the first subpixel and a second-second anode in the second subpixel,
wherein a barrier layer is disposed on the first-first anode and the metal ink pattern, and
wherein the second-first anode is disposed on the barrier layer and is connected to the first rendering electrode.

11. The organic light emitting diode display device of claim 9, further comprising an overcoat layer between the thin film transistor and the first anode,
wherein the overcoat layer includes a groove corresponding to the metal ink pattern.

12. A method of fabricating an organic light emitting diode display device, comprising:
forming a thin film transistor in each of first and second subpixels on a substrate, each of the first and second subpixels having an emission area;
forming a first anode connected to the thin film transistor and having a first area;
performing an array test to the substrate; and
forming a second anode on the first anode, the second anode having a second area greater than the first area.

13. The method of claim 12, further comprising, when one of the first and second subpixels has deterioration in the array test, performing a repair process to the thin film transistor exposed outside the first anode before forming the second anode.

14. The method of claim 12, wherein the first and second subpixels emit a same colored light as each other,
wherein the first anode includes a first-first anode in the first subpixel and a first-second anode in the second subpixel, and the second anode includes a second-first anode in the first subpixel and a second-second anode in the second subpixel, and
wherein a first rendering electrode is connected to the first-first anode through a first bridge electrode in the first subpixel, and a second rendering electrode is connected to the first-second anode through a second bridge electrode in the second subpixel.

15. The method of claim 14, further comprising: when the first subpixel has deterioration in the array test,
removing the first bridge electrode to form a laser cutting area;
forming a metal ink pattern between the first and second rendering electrodes;
forming a barrier layer on the first-first anode and the metal ink pattern; and
forming a second-first anode and a second-second anode on the barrier layer in the first subpixel and the second subpixel, respectively, the second-first anode connected to the first rendering electrode, and the second-second anode contacting the first-second anode.

16. An organic light emitting diode display device, comprising a plurality of subpixels, each subpixel comprising:
a thin film transistor;
a first anode connected to the thin film transistor and having a first area; and
a second anode having a second area greater than the first area and corresponding to an emission area of the subpixel,
wherein the second anode is disposed on the first anode to cover the first anode.

17. The organic light emitting diode display device of claim 16, wherein the thin film transistor and a plurality of signal lines for supplying signals to the plurality of subpixels are not covered by the first anode.

* * * * *